(12) United States Patent
Stoddard et al.

(10) Patent No.: US 6,554,654 B1
(45) Date of Patent: Apr. 29, 2003

(54) MULTI-PIN EDGE CONNECTOR FOR CIRCUIT BOARD

(75) Inventors: D. Joseph Stoddard, San Jose, CA (US); Joseph P. Miller, Cypress, TX (US); Mitchel Wright, The Woodlands, TX (US)

(73) Assignee: Hewlett-Packard Development Company, L.P., Palo Alto, CA (US)

( * ) Notice: Subject to any disclaimer, the term of this patent is extended or adjusted under 35 U.S.C. 154(b) by 0 days.

(21) Appl. No.: 10/039,161

(22) Filed: Dec. 31, 2001

(51) Int. Cl.[7] .............................................. H01R 13/24
(52) U.S. Cl. ........................... 439/700; 439/79; 439/59
(58) Field of Search .......................... 439/700, 78, 79, 439/62, 55, 65, 74, 131; 324/158 R, 158 P

(56) References Cited

U.S. PATENT DOCUMENTS 5,256,073 A * 10/1993 Reymond et al. ............. 439/79
6,388,202 B1 * 5/2002 Swirbel et al. ............. 174/261

* cited by examiner

Primary Examiner—P. Austin Bradley
Assistant Examiner—Alexander Gilman
(74) Attorney, Agent, or Firm—Akin Gump Strauss Hauer & Feld LLP

(57) ABSTRACT

A multi-pin edge connector assembly for connecting a daughter board to a mother board, for example, comprises a plurality of vias with conductive surfaces that are formed in the daughter board adjacent a connection edge. A plurality of openings are also formed in the daughter board, with each opening extending from the connection edge to one of the vias. Electrically conductive pins are positioned in the openings, with each pin having a first end in electrical contact with one of the conductive surfaces and a second end that projects beyond the connection edge for electrically contacting conductive pads or surfaces on the mother board. A retainer is mounted to the daughter board for holding the pins in their respective openings.

24 Claims, 7 Drawing Sheets

MULTI-PIN EDGE CONNECTOR FOR CIRCUIT BOARD

CROSS-REFERENCE TO RELATED APPLICATIONS

Not applicable.

STATEMENTS REGARDING FEDERALLY SPONSORED RESEARCH OR DEVELOPMENT

Not applicable.

REFERENCE TO A MICROFICHE APPENDIX

Not applicable.

BACKGROUND OF THE INVENTION

1. Field of the Invention

This invention relates to connectors for circuit boards, and more particularly to a multi-pin edge connector assembly for electrically connecting one circuit board to another circuit board.

2. Description of the Related Art

High speed connectors require low loss, low crosstalk, controlled impedance, and minimum physical size. Available connectors designed to operate above 1 GHz typically include embedded transmission line structures. In some cases, a coaxial transmission line is created at considerable cost. In other cases, stripline structures are created with multiple ground planes and segregate signal pins. These approaches create complex structures which are inherently costly and physically large.

It would therefore be desirable to provide a connector that has a relatively small profile and is relatively low in cost, yet capable of meeting the requirements of today's high speed connectors.

SUMMARY OF THE INVENTION

According to one aspect of the invention, a multi-pin edge connector assembly comprises a circuit board and an edge connector adapted for connection to the circuit board. The circuit board has opposite sides and a connection edge extending between the opposite sides. A plurality of vias with conductive surfaces are formed in the circuit board adjacent the connection edge. The edge connector has a plurality of electrically conductive pins. Each pin includes a first end for electrically contacting one of the conductive surfaces and a second end that projects beyond the connection edge. A retainer is adapted for connection to the circuit board for holding the pins in electrical contact with the conductive surfaces.

According to a further aspect of the invention, a multi-pin edge connector assembly comprises a circuit board and an edge connector mounted to the circuit board. The circuit board has opposite sides and a connection edge extending between the opposite sides. A plurality of vias with conductive surfaces are formed in the circuit board adjacent the connection edge. A plurality of openings are also formed in the circuit board, with each opening extending from the connection edge to one of the vias. The edge connector comprises a plurality of electrically conductive pins. Each pin has a first end in electrical contact with one of the conductive surfaces, a second end that projects beyond the connection edge, and a middle portion located between the ends and positioned in one of the openings. A retainer is mounted to the circuit board for holding the pins in electrical contact with the conductive surfaces.

According to an even further aspect of the invention, a multi-pin edge connector assembly for connecting a daughter board to a mother board, for example, comprises a plurality of vias with conductive surfaces that are formed in the daughter board adjacent a connection edge. A plurality of openings are also formed in the daughter board, with each opening extending from the connection edge to one of the vias. A plurality of electrically conductive pins are positioned in the openings. Each pin has a first end in electrical contact with one of the conductive surfaces and a second end that projects beyond the connection edge for electrically contacting conductive pads or surfaces on the mother board. A retainer is mounted to the daughter board for holding the pins thereon.

BRIEF DESCRIPTION OF THE SEVERAL VIEWS OF THE DRAWINGS

Embodiments of the present invention will hereinafter be described in conjunction with the appended drawings, wherein.

DETAILED DESCRIPTION OF THE INVENTION

Figure 1:
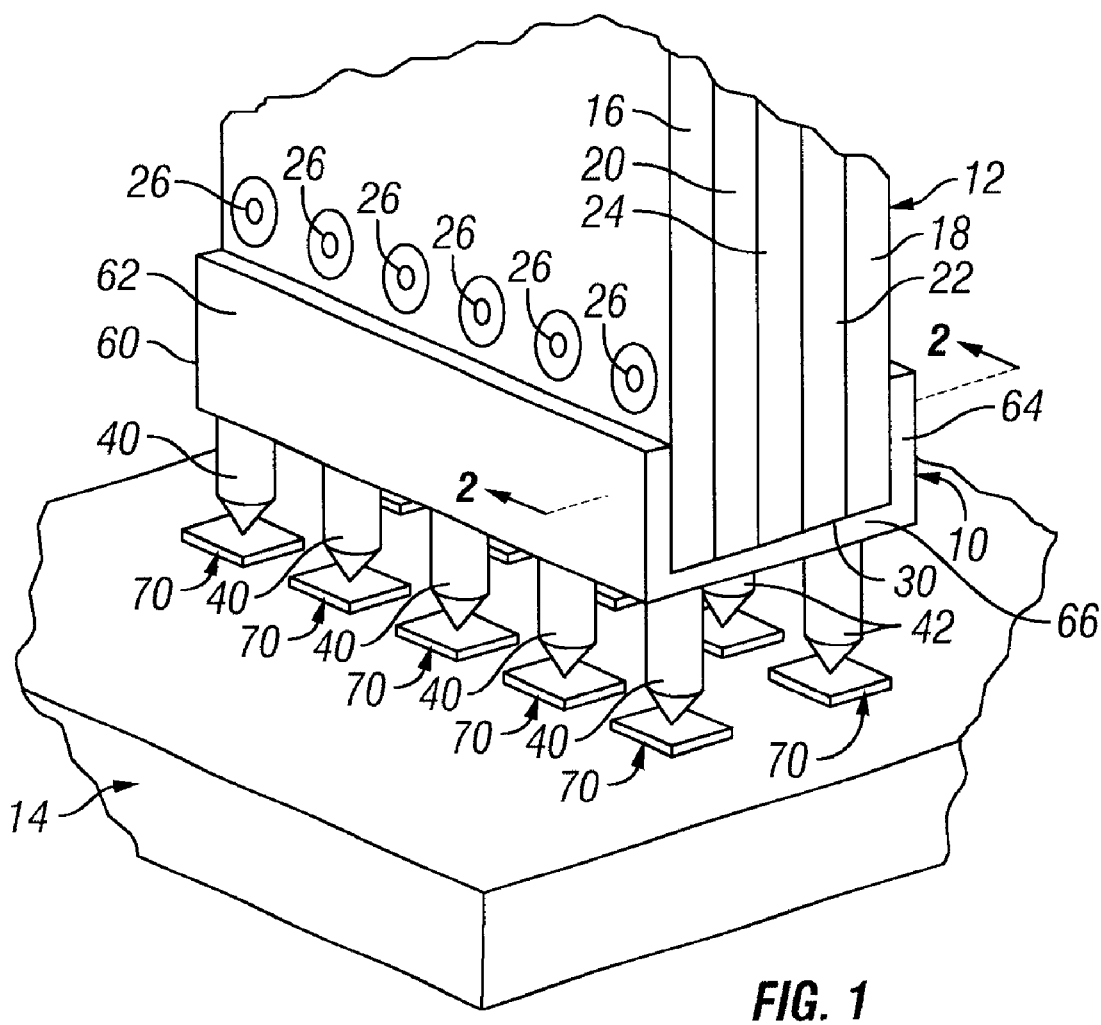
FIG. 1 is an isometric view of a multi-pin edge connector assembly in accordance with the present invention for connecting a first circuit board with a second circuit board.
Figure 2:
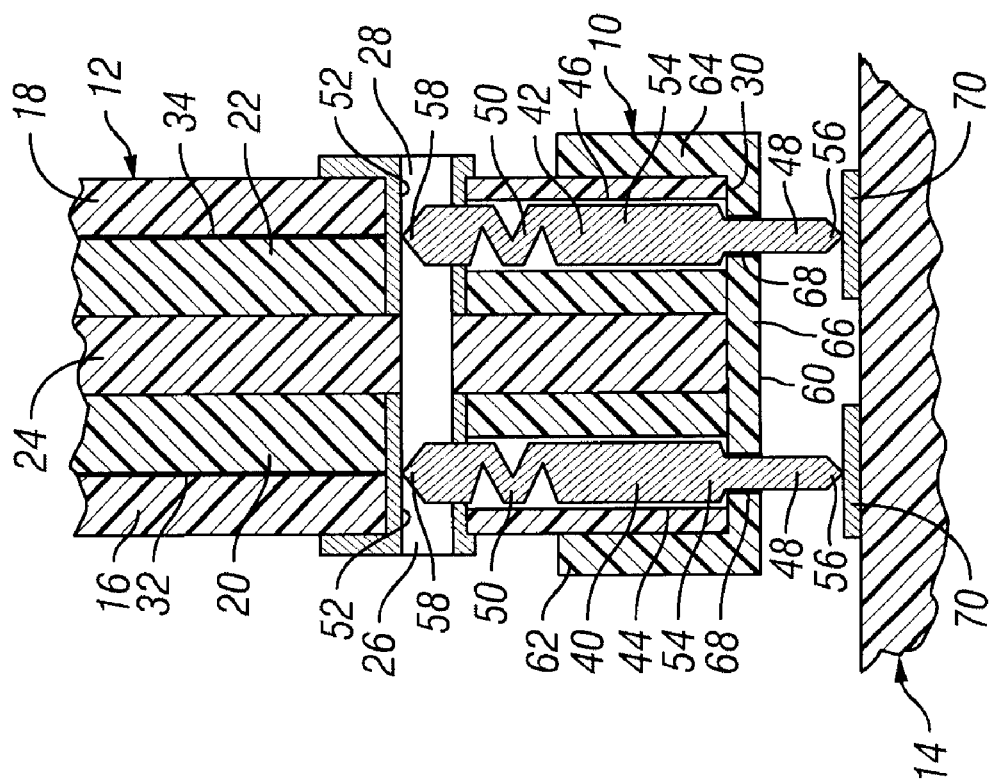
FIG. 2 is a sectional view of the edge connector assembly taken along line 2—2 of FIG. 1 for pairs of blind vias.

Referring now to the drawings, and to FIGS. 1 and 2 in particular, a multi-pin edge connector assembly in accordance with an exemplary embodiment of the invention includes an edge connector 10 that is mounted to a first circuit board 12 for electrically connecting the first circuit board 12 with a second circuit board 14 or other electrical circuitry or components. By way of example, the first circuit board can be a daughter board and the second circuit board can be a mother board to which the daughter board electrically connects.

As shown, the circuit board 12 can comprise outer layers 16, 18 and inner layers 20, 22 and 24 that are sandwiched between the outer layers. The circuit board 12 is preferably of conventional construction and can include conductive and ground planes as well as electrical circuitry and components mounted thereto in a well-known manner. As shown in FIG. 2, a plurality of front blind vias 26 and rear blind vias 28 are formed in the circuit board 12 in a well-known manner with the front vias 26 separated from the rear vias 28 by the inner layer 24. Preferably, each front via 26 is aligned with one of the rear vias 28 and the front and rear vias are spaced an equal distance from a mounting edge 30 of the circuit board 12. Alternatively, the vias can be spaced from the mounting edge 30 at different distances, as will be described with respect to the FIG. 10 embodiment. Electrically conductive traces 32, 34 can extend from the vias 26, 28 for connection to other circuitry and/or components (not shown) associated with the circuit board 12.

Although the circuit board 12 has been illustrated and described with a particular number of layers, it will be understood that the circuit board 12 can comprise more or less layers of insulating material and conductive planes or traces. By way of example, the circuit board 10 may comprise a single layer of insulating material with an etched conductive plane on one or both sides in a well-known manner to produce either a single-sided or double-sided circuit board to which electrical components (not shown) can be connected.

The edge connector 10 includes a plurality of front pins 40 and rear pins 42 that are located in front bores 44 and rear bores 46, respectively, formed in the circuit board 12, and a retainer 60 that holds the pins in their respective bores. As shown, each pin 40, 42 is preferably constructed of an electrically conductive material and includes a narrow portion 48 that projects outwardly from the mounting edge 30 of the circuit board 12, a resilient portion 50 that presses against a conductive surface 52 of the vias 26 and 28, and a middle portion 54 that extends between the narrow and resilient portions. Preferably, the narrow portion 48 includes a conical or wedge tip 56 for contacting conductive pads 70 on the circuit board 14. Likewise, the resilient portion 50 preferably includes a conical or wedge tip 58 for contacting the conductive surface 52 of its respective via. The conical or wedge tips 56, 58 ensure that any contamination on the conductive surfaces 52 or conductive pads 70 are penetrated to thereby make good electrical contact. Although not shown, the conductive pads 70 are electrically connected to electrical circuitry and/or components associated with the circuit board 14 in a well-known manner.

The vias are preferably located as close as possible to the mounting edge 30 of the circuit board 12, in order to minimize the length of the pins, reduce material cost, and potentially improve high-speed performance. By way of example, the distance between the mounting edge 30 and the vias can be about 2.5 mm. However, it will be understood that the vias may be located closer to or further from the mounting edge 30.

The retainer 60 is preferably constructed of an electrically insulating material and is U-shaped in cross section with a front wall 62, a rear wall 64, and a bottom wall 66 that extends between the front and rear walls. The retainer 60 can be mounted to the circuit board through adhesives, mechanical fasteners, friction fit, and/or other well-known mounting means, with the front wall 62 adjacent the outer layer 16, the rear wall 64 adjacent the outer layer 18, and the bottom wall 66 adjacent the mounting edge 30. The bottom wall 66 has a plurality of openings 68 that are sized to accept the narrow portions 48 of the pins 40, 42. The resilient portion 50 of each pin causes the middle portion 54 to press against the bottom wall 66. The construction and arrangement of the pins in this manner ensures that t electrical contact between the vias 26, 28 and their associated conductive pads 70 is maintained even with large ranges in manufacturing tolerances and operating temperatures. The density of the pins can be as much as 100 per inch or more. For embodiments where buried vias (not shown) may be used, the pin density can be as much as 150 pins per inch or more.

Figure 3:
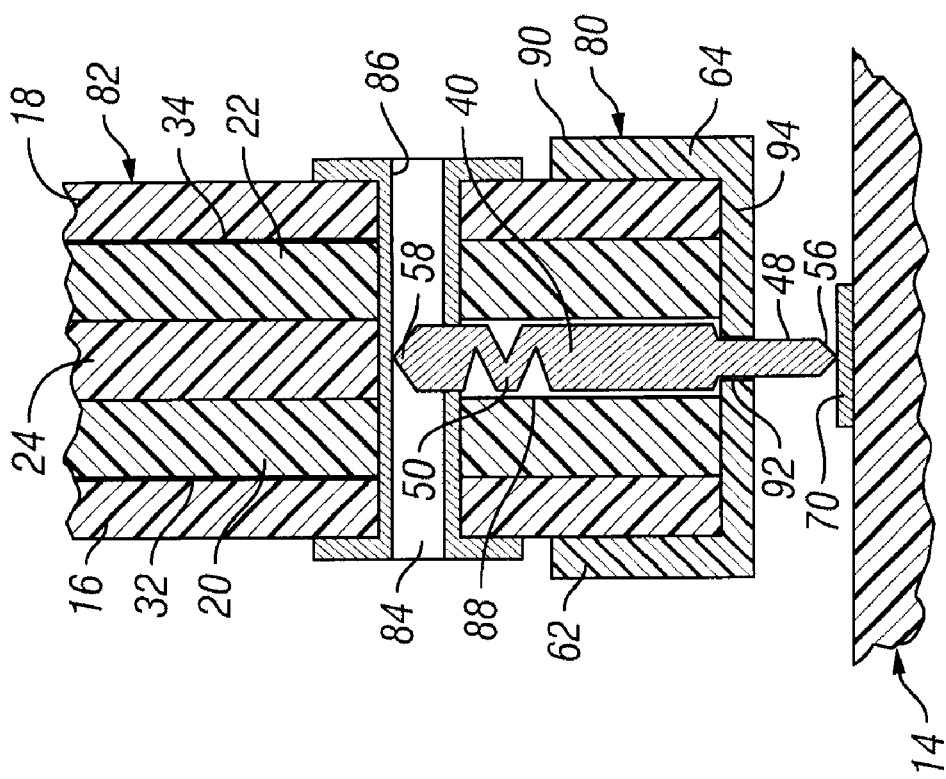
FIG. 3 is a sectional view of an edge connector assembly according to a further embodiment of the invention for through-vias.

With reference now to FIG. 3, a multi-pin edge connector assembly in accordance with a further embodiment of the invention is illustrated, wherein like parts in the previous embodiment are represented by like numerals. The multi-pin edge connector assembly includes an edge connector 80 mounted to a circuit board 82. The circuit board 82 is similar in construction to the circuit board 12, with the exception that one or more of the blind vias are replaced with a through-via 84. The through-via 84 has a conductive surface 86 that extends through the layers 16–24 of the circuit board 82. When through-vias are used in place of the blind vias, only a single row of pins 40 are needed to connect the circuit board 82 to the circuit board 14. Each pin 40 is positioned in a bore 88 formed in the circuit board 82. A retainer 90 holds the pins 40 in their respective bores with the narrow portion 48 of each pin 40 extending through an opening 92 formed in the bottom wall 94 of the retainer. As in the previous embodiment, the tip 56 of the narrow portion is adapted to contact a pad 70 of the circuit board 14 while the tip 58 of the resilient portion 50 is in contact with the conductive surface 86 of its associated through-via 84. Electrically conductive traces 32, 34 can extend from the through-vias 84 for connection to other circuitry and /or components (not shown) associated with the circuit board 12.

Figure 4:
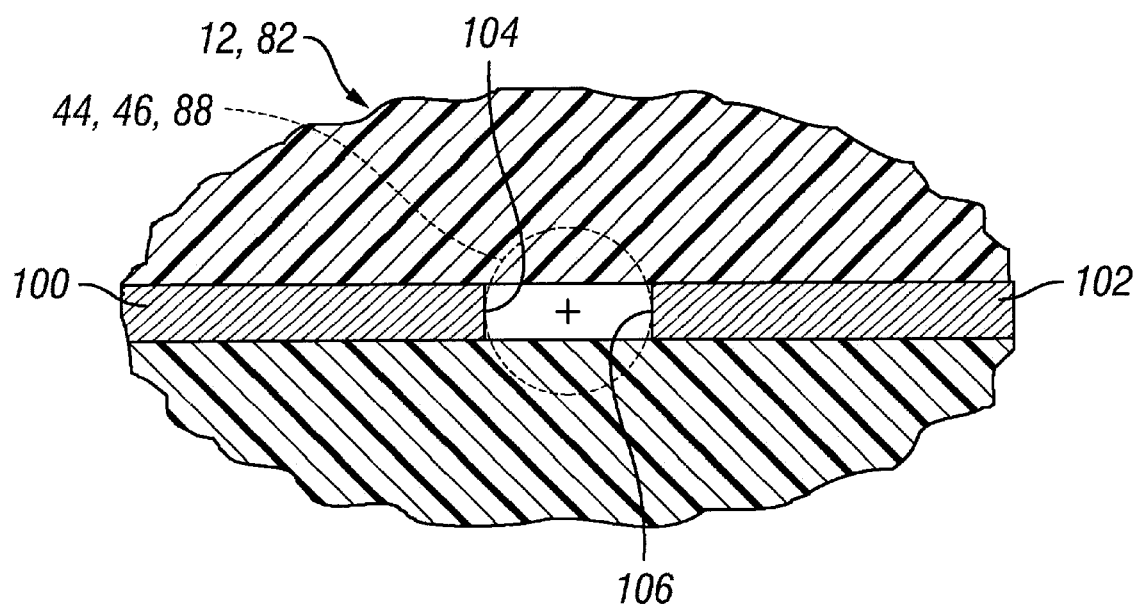
FIG. 4 is an enlarged sectional view of a multilayer circuit board arranged for forming a connector pin passage between the circuit board edge and a transverse via.

With reference now to FIG. 4, the bores 44, 46 and 92 of the previous embodiments are preferably formed after the layers 16–24 of the circuit board have been laminated, such as by drilling. In order to prevent drill bit wandering during the drilling operation, a metal pattern comprising spaced fingers 100 and 102 is preferably formed on one of the layers before lamination through well-known techniques. The spaced fingers 100 and 102 have facing edges 104 and 106, respectively, that define a drill path for the bore. Preferably, the edges 104 and 106 are straight and extend parallel to each other from the mounting edge 30 to the via. During drilling, the drill bit is positioned at the mounting edge 30 in alignment with the selected via. Due to the relatively small diameter of the drill bit, it may attempt to wander out of a straight line path and thereby contact one of the metal fingers 100 or 102. This contact will tend to increase pressure on the drill bit and drive it back toward the center of the bore. Although metal is preferred, it will be understood that other material can be used to form the fingers. It will be further understood that a plurality of drill bits can be used simultaneously to form a plurality of bores. Instead of spaced fingers, and in accordance with a further embodiment of the invention, a plurality of pads can be formed on opposite sides of the drill path.

Figure 5:
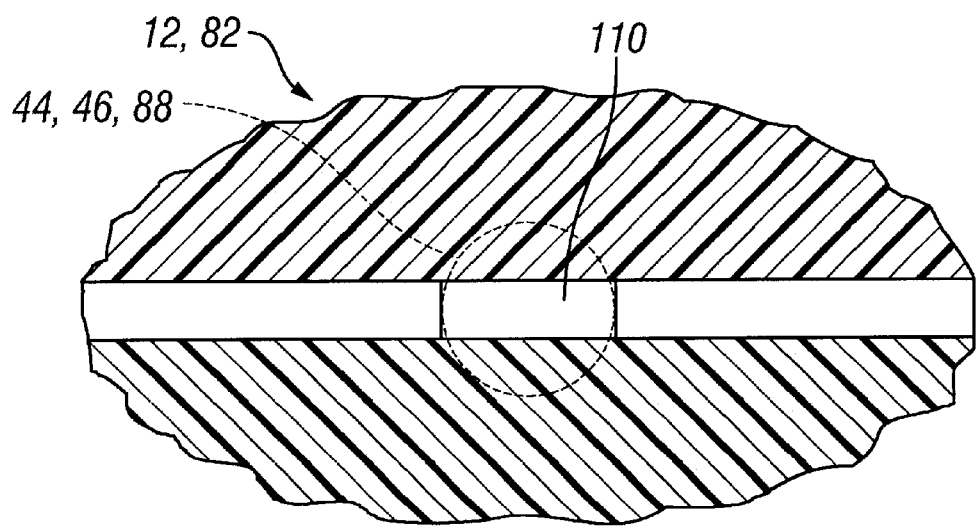
FIG. 5 is an enlarged sectional view of a multilayer circuit board arranged according to a further embodiment of the invention for forming a connector pin passage between the circuit board edge and a transverse via.

With reference now to FIG. 5, the bores 44, 46 and 92 of the previous embodiments can alternatively be formed by providing a relatively soft layer 110 of material that is more easily drilled than the surrounding relatively harder laminate material to thereby create a preferred drill path. The soft layer 110 can be a graphite material or the like that is printed on a layer of the circuit board prior to lamination. Alternatively, the relatively soft layer 110 can be formed of a precut material that is adhered or otherwise attached to a circuit board layer prior to lamination. Preferably, the soft layer 110 defines a straight drill path for the bore that extends from the mounting edge 30 to the via. During drilling, the drill bit is positioned at the mounting edge 30 in alignment with the selected via and the soft layer 110. As the drill bit enters into the material, it will naturally tend to follow the path of least resistance through the soft layer, thereby ensuring that the formed bore will be straight.

Although drilling is the preferred method of forming the bores in the above-described embodiments, it will be understood that other well-known material removal techniques can be used, as will be described by way of example below.

Figure 6:
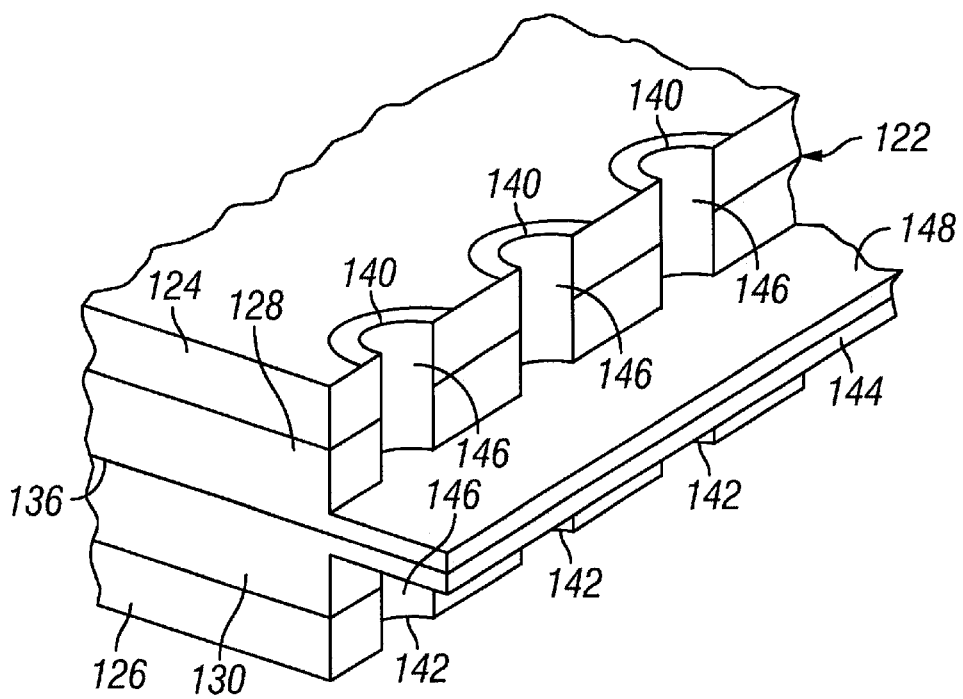
FIG. 6 is a perspective view of a portion of a multilayer circuit board that is shaped for receiving a multi-pin edge connector in accordance with a further embodiment of the invention.
Figure 7:
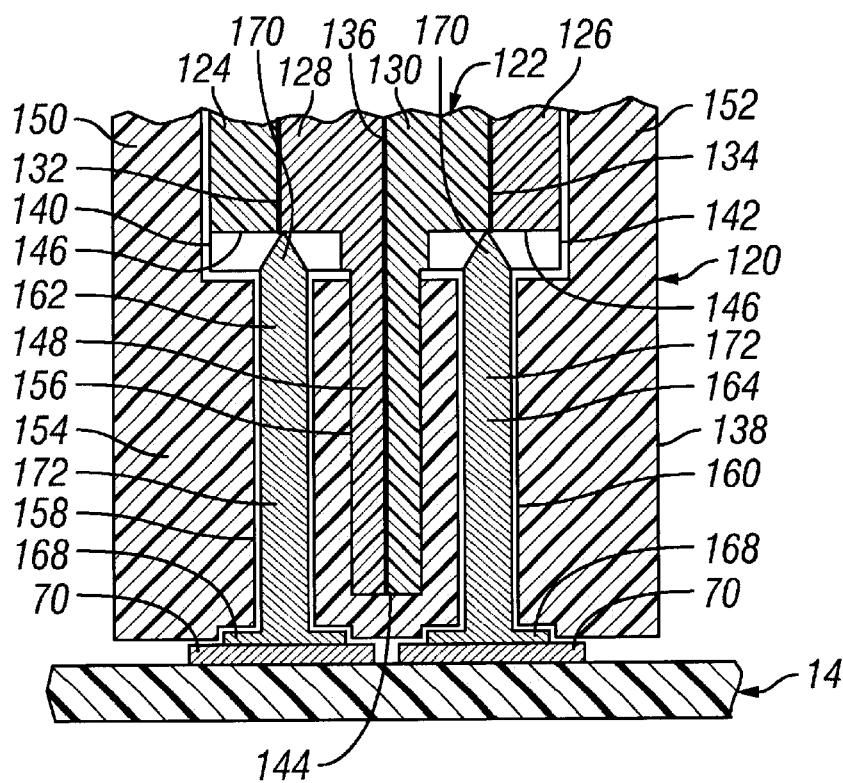
FIG. 7 is a sectional view of the circuit board of FIG. 6 and an installed multi-pin edge connector in accordance with the present invention.

With reference now to FIGS. 6 and 7, a multi-pin edge connector assembly in accordance with a further embodiment of the invention is illustrated, wherein like parts in the previous embodiments are represented by like numerals. The edge connector assembly includes an edge connector 120 mounted to a circuit board 122. The circuit board 122 includes outer layers 124 and 126, and inner layers 128 and 130 sandwiched between the outer layers. Conductive planes or traces 132 and 134 are located between the outer and inner layers, while a conductive ground plane 136 is located between the inner layers. Front blind vias 140 and rear blind vias 142 are formed in the circuit board 122 in a well-known manner with the front vias 140 separated from the rear vias 142 by the inner layers 128 and 130. Preferably, each front via 140 is aligned with one of the rear vias 142 and the front and rear vias are spaced an equal distance from a mounting edge 144 of the circuit board 122.

As shown most clearly in FIG. 6, material from the circuit board 122 is preferably removed from the mounting edge 144 to approximately half way through the front and rear blind vias 140 and 142 to thereby expose conductive surfaces 146 of the blind vias and form a mounting protrusion 148 that includes the mounting edge 144. However, it will be understood that more or less material can be removed, as long as the vias are at least partially exposed from the mounting edge. The material can be removed through milling, routing, sawing, or any well known material removing means.

Although the circuit board 122 has been illustrated and described with a particular number of layers, it will be understood that the circuit board 122 can comprise more or less layers of insulating material and conductive planes or traces.

As shown in FIG. 7, the edge connector 120 includes a retainer 138 that is preferably constructed of an electrically insulating material and is U-shaped in cross section with a front wall 150, a rear wall 152, and a bottom wall 154 that extends between the front and rear walls. A slot 156 extends along the length of the bottom wall 154 and is sized for receiving the mounting protrusion 148. A plurality of front bores 158 and rear bores 160 extend through the bottom wall 154 and are in alignment with the front blind vias 140 and rear blind vias 142, respectively. The retainer 138 can be mounted to the circuit board through adhesives, mechanical fasteners, friction fit, and/or other well-known mounting means.

A plurality of front pins 162 and rear pins 164 are located in the front bores 158 and rear bores 160, respectively, of the retainer 138. As shown, each pin 162, 164 is preferably constructed of an electrically conductive material and includes a base portion 168 that is preferably soldered or otherwise electrically connected to one of the conductive pads 70 of the circuit board 14, a contact portion 170 that presses against the conductive surface 146 of an associated via 140, 142, and a middle portion 172 that extends between the base and contact portions. Preferably, the contact portion 170 is of a conical or wedge tip shape to ensure that any contamination on the conductive surfaces 146 are penetrated to thereby make good electrical contact. Preferably, the retainer 138 is mounted on the circuit board 14 with the pins 162, 164 soldered on the pads 70 and located within their respective bores 158, 160. Guides (not shown) can be provided on the edge connector 120 for positioning and securing the circuit board 122 in place with the contact portion 170 of each pin in electrical contact with its respective via. When the board 122 is installed in the edge connector 120, the ground plane 136 preferably extends between the front pins 162 and rear pins 164 and to the mounting edge 144 to provide isolation between the front and rear pins and coupling between pins on the same side of the ground plane.

In accordance with the above-described arrangement, and by way of example, the pins 152, 164 can be approximately 1.25 mm in length, although other lengths are contemplated. The density of the pins, as in the previous embodiments, can be up to approximately 100 per inch or 4 per millimeter. For embodiments where buried vias (not shown) may be used, the pin density can be up to approximately 150 pins per inch or more. It will be understood that blind vias, through-vias and/or buried vias can be used in combination depending on the required pin density and particular board configuration and requirements.

Figure 8:
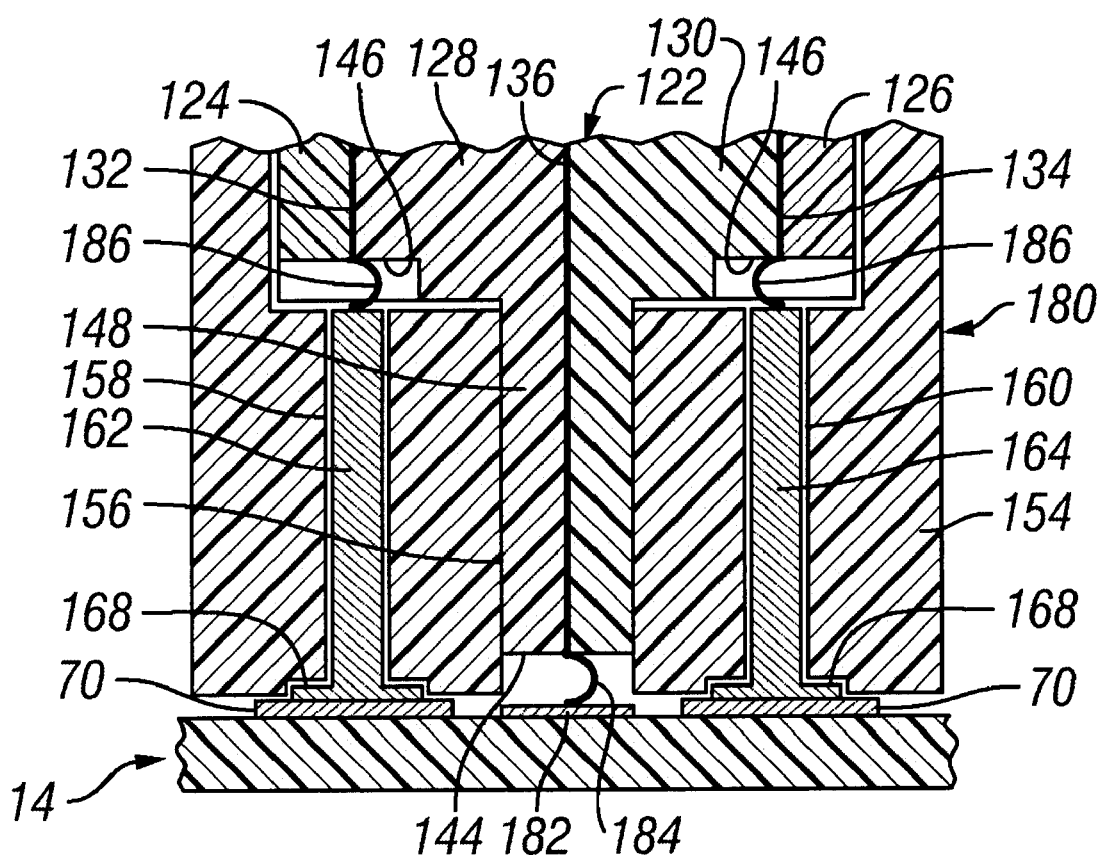
FIG. 8 is a sectional view similar to FIG. 7 of the circuit board of FIG. 6 and an installed multi-pin edge connector in accordance with a further embodiment of the present invention.

With reference now to FIG. 8, a multi-pin edge connector assembly in accordance with a further embodiment of the invention is illustrated, wherein like parts in the previous embodiments are represented by like numerals. The edge connector assembly includes an edge connector 180 mounted to a circuit board 122. The edge connector 180 is similar in construction to the edge connector 122 previously described. However, the slot 156 in the edge connector 180 extends completely through the bottom wall 154 to expose the ground plane 136. Preferably, a conductive pad 182 on the circuit board 14 is in alignment with the slot 156. A conductive spring contact 184 is compressed between the pad 182 and the mounting edge 144 to electrically connect the ground plane 136 with the pad 182. Likewise, a spring contact portion 186 of each pin 162, 164 is compressed between the middle portion 172 and the conductive surface 146 of each via 140, 142 to thereby electrically connect the traces 132, 134 with the conductive pads 70.

Figure 9:
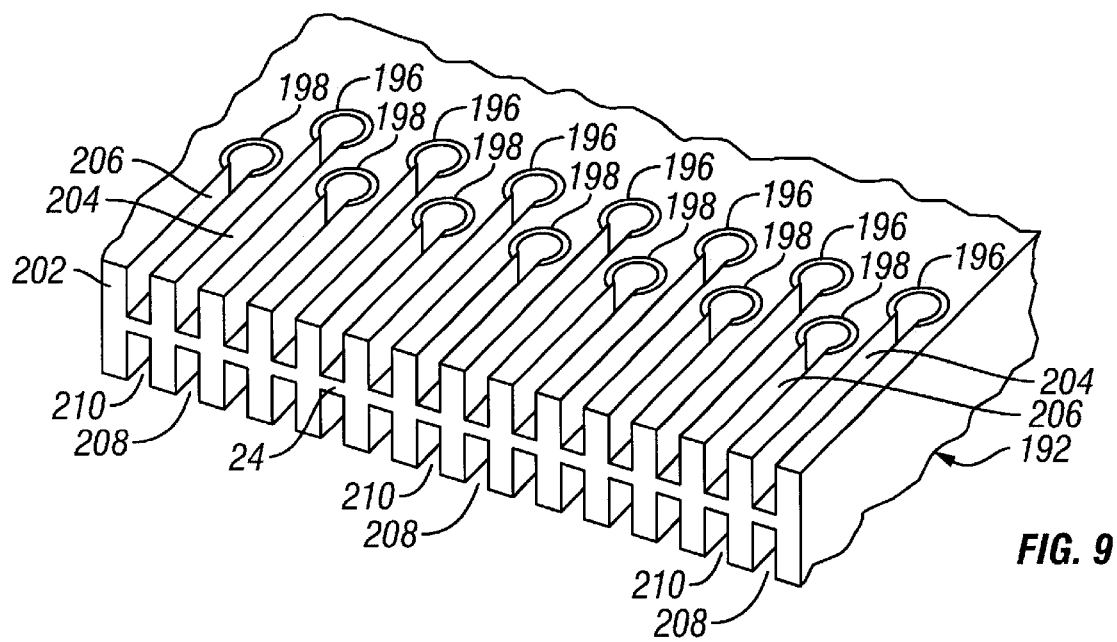
FIG. 9 is a perspective view of a portion of the multilayer circuit board that is shaped for receiving a multi-pin edge connector in accordance with a further embodiment of the invention.
Figure 10:
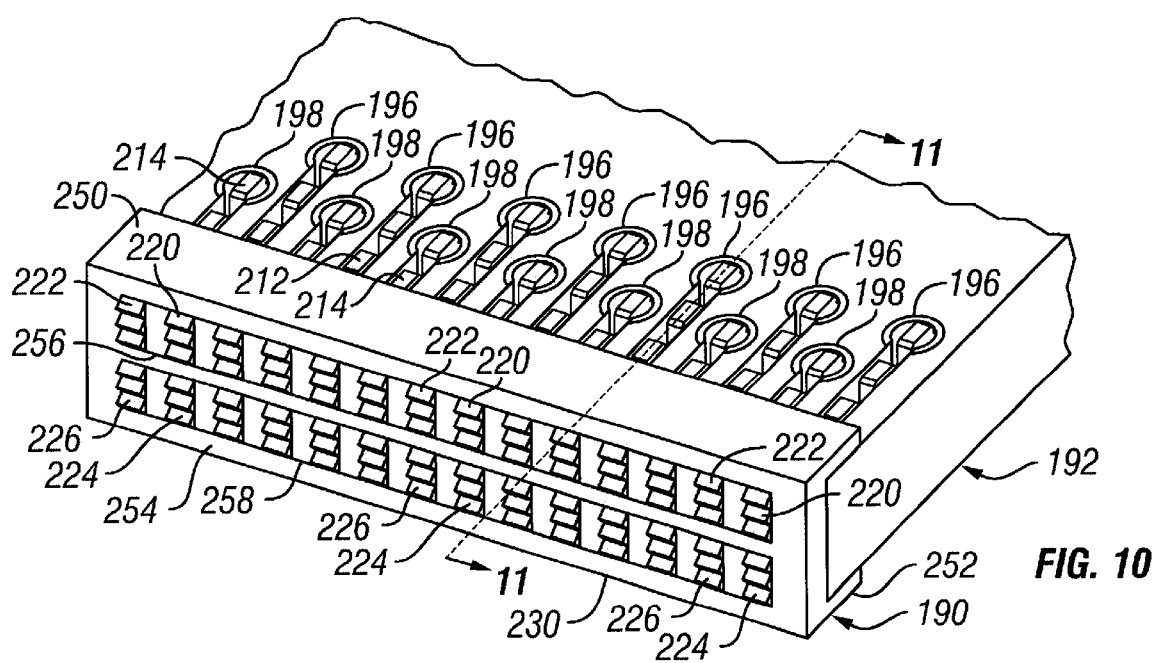
FIG. 10 is a perspective view of a multi-pin edge connector assembly incorporating the circuit board of FIG. 9 in accordance with the invention.
Figure 11:
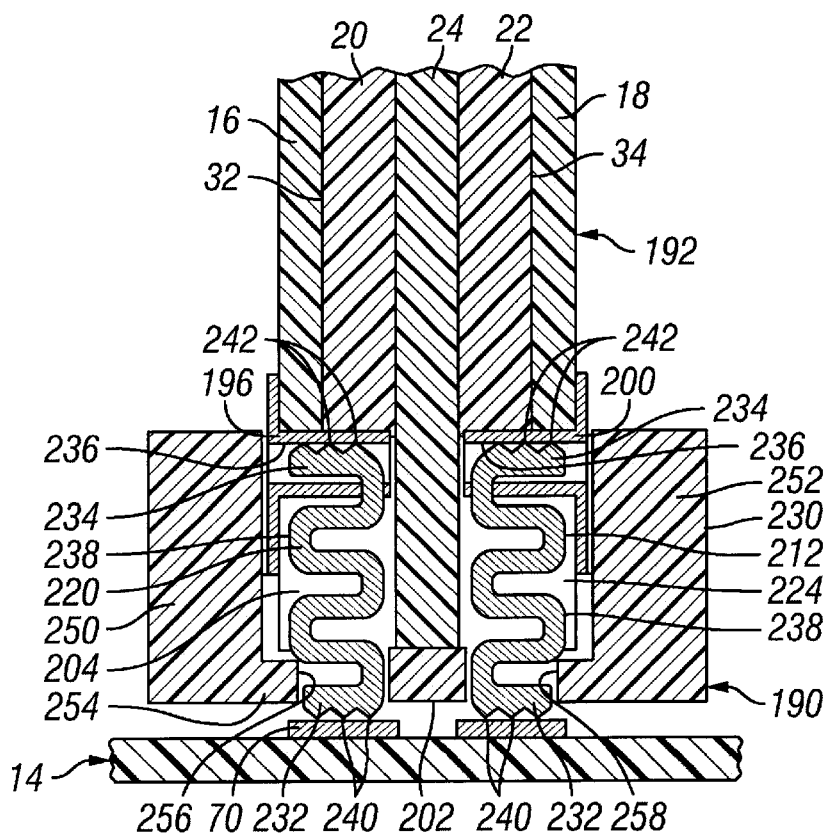
FIG. 11 is a sectional view of the multi-pin edge connector assembly taken along line 11—11 of FIG. 10.

With reference now to FIGS. 9–11, a multi-pin edge connector assembly in accordance with a further embodiment of the invention is illustrated, wherein like parts in the previous embodiments are represented by like numerals. The edge connector assembly includes an edge connector 190 mounted to a circuit board 192. The circuit board 192 can be similar in construction to the circuit board 12 previously described, with outer layers 16, 18 and inner layers 20, 22 and 24 sandwiched between the outer layers. The circuit board 12 can include conductive planes or traces 32, 34 and ground planes or traces (not shown) as well as electrical circuitry and components mounted thereto in a well-known manner.

A first row of front blind vias 196 and a second offset row of front blind vias 198 are formed in the circuit board 192. Likewise, a first row of rear blind vias 200 and a second row of rear blind vias (not shown) are formed in the circuit board 12 in a well-known manner with the front vias separated from the rear vias by the inner layer 24. Preferably, each front via is aligned with a corresponding rear via with the first rows of the front and rear vias spaced a first distance from a mounting edge 202 of the circuit board 192 and the second rows of the front and rear vias spaced a second distance from the mounting edge 202. The first distance is preferably longer than the second distance so that the first and second rows of vias are offset. In this manner, a greater number of vias can be formed in the circuit board close to the mounting edge 202 to accommodate a greater pin density than a single row of vias. Front slots 204 and 206 extend between the mounting edge 202 and the front vias 196 and 198, respectively. Likewise, rear slots 208 and 210 extend between the mounting edge 202 and the rear vias. In order to form the slots, material from the circuit board 192 can be removed by sawing, milling, laser cutting, or other well-known material removing means. In accordance with one embodiment, a plurality of circular saw blades can be located on a common shaft and spaced along the shaft at a distance equal to the distance between the slots. The thickness of the saw blades can be chosen to obtain a desired slot width. The circuit board 192 can also include an alignment slot (not shown) that can receive an alignment tab (not shown) associated with the ganged saw blades to thereby ensure that the saw blades are aligned with the vias prior to forming the slots.

Although the circuit board 192 has been illustrated and described with a particular number of layers, it will be understood that the circuit board 192 can comprise more or less layers of insulating material and conductive planes or traces.

The edge connector 190 includes a plurality of front pins 220 and 222 that are located in the first and second rows of front slots 204 and 206, respectively, a plurality of rear pins 224, 226 that are located in the first and second rows of rear slots 208 and 210, respectively, and a retainer 230 that holds the pins in their respective slots. Each pin is preferably constructed of an electrically conductive material and includes a first contact portion 232 that projects outwardly from the mounting edge 202 of the circuit board 192, a second contact portion 234 that presses against a conductive surface 236 of its associated via, and a resilient middle portion 238 that extends between the first and second contact portions. Preferably, the first contact portion 232 includes a plurality of conical or wedge tips 240 for contacting a conductive pad 70 on the circuit board 14. Likewise, the second contact portion 234 preferably includes a plurality of conical or wedge tips 242 for contacting the conductive surface 236 of its associated via. Preferably, the resilient middle portion 238 is serpentine-shaped.

The retainer 230, as in the previous embodiments, is preferably constructed of an electrically insulating material and is U-shaped in cross section with a front wall 250, a rear wall 252, and a bottom wall 254 that extends between the front and rear walls. The retainer 230 can be mounted to the circuit board through adhesives, mechanical fasteners, friction fit, and/or other well-known mounting means, with the front wall 250 adjacent the outer layer 16, the rear wall 252 adjacent the outer layer 18, and the bottom wall 254 adjacent the mounting edge 202. The bottom wall 254 has a pair of longitudinally extending openings 256 and 258 that are sized to accept the first contact portions 232 of the pins 220–226. The resilient middle portion 238 of each pin presses against the bottom wall 254 to hold the pin in its respective circuit board slot. The construction and arrangement of the pins in this manner ensures that electrical contact between the vias and their associated conductive pads 70 is maintained even with large ranges in manufacturing tolerances and operating temperatures.

Figure 12:
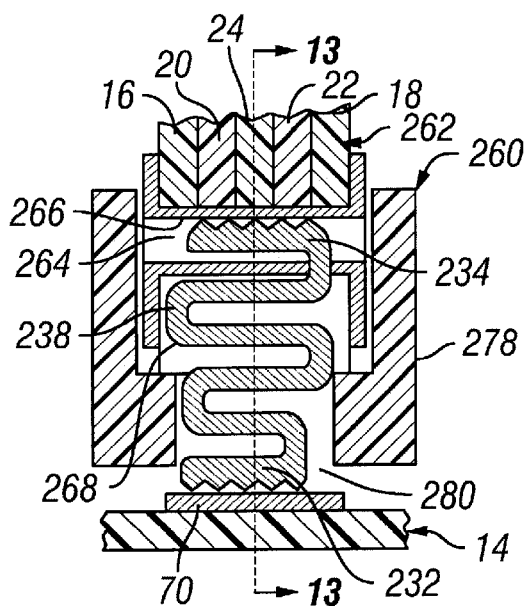
FIG. 12 is a sectional view of a multi-pin edge connector assembly according to a further embodiment of the invention for through-vias.
Figure 13:
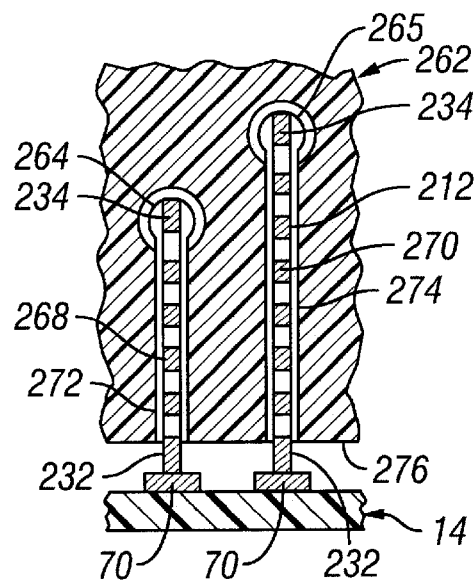
FIG. 13 is a sectional view of the multi-pin edge connector assembly taken along line 13—13 of FIG. 12. Embodiments of the present invention will now be described in greater detail with reference to the drawings, wherein like parts throughout the drawing figures are represented by like numerals.

With reference now to FIGS. 12 and 13, a multi-pin edge connector assembly in accordance with a further embodiment of the invention is illustrated, wherein like parts in the previous embodiments are represented by like numerals. The multi-pin edge connector assembly includes an edge connector 260 mounted on a circuit board 262. The circuit board 262 is similar in construction to the circuit board 192 previously described, with the exception of offset through-vias 264 and 265 with a conductive surface 266 that extends through the layers 16–24 of the circuit board 192. With this arrangement, first and second rows of offset pins 268 and 270, respectively, replace the first and second rows of front and rear pins of the previous embodiment to thereby connect the circuit board 192 to the circuit board 14. The pins 268 and 270 are preferably similar in construction to the pins 220–226 previously described, and are positioned in slots 272 and 274, respectively, that extend from their respective through-vias 264, 265 to a mounting edge 276 of the circuit board 262. The first contact portion 232 of each pin 268, 270 is adapted to electrically contact a pad 70 of the circuit board 14, and the second contact portion 234 is in electrical contact with the conductive surface 266 of its associated via. A retainer 278 holds the pins 268 and 270 in their respective slots with the first contact portion 232 of each pin 40 extending through an elongate opening 280 formed in the retainer 278.

With the above-described embodiments, it is believed that high-speed performance is improved over prior art solutions by reducing component size and length. In accordance with one embodiment of the present invention, connector lengths are reduced to approximately 1.25–2.5 mm from approximately 6–10 mm of the prior art. It will be understood that the connector lengths can be shorter or longer depending on the particular construction and materials used to fabricate the circuit board and/or the connector assemblies.

It will be understood that terms of orientation and/or position as may be used throughout the specification, including front, rear, bottom, middle, and their respective derivatives and equivalent terms, refer to relative, rather than absolute orientations and/or positions.

While the invention has been taught with specific reference to the above-described embodiments, those skilled in the art will recognize that changes can be made in form and detail without departing from the spirit and the scope of the invention. By way of example, the plated vias in each of the above-described embodiments can be a combination of double blind vias, through-vias and/or hidden vias. Thus, the described embodiments are to be considered in all respects only as illustrative and not restrictive. The scope of the invention is, therefore, indicated by the appended claims rather than by the foregoing description. All changes that come within the meaning and range of equivalency of the claims are to be embraced within their scope.

We claim:

1. A multi-pin edge connector assembly comprising:
   a circuit board having:
      opposite sides and a connection edge extending between the opposite sides; and
      a plurality of vias with conductive surfaces formed in the circuit board adjacent the connection edge; and
   an edge connector having:
      a plurality of electrically conductive pins, each pin having a first end extending generally transverse to the plurality of vias for electrically contacting one of the conductive surfaces and a second end that projects beyond the connection edge; and
      a retainer adapted for connection to the circuit board for holding the pins in electrical contact with the conductive surfaces.

2. A multi-pin edge connector assembly according to claim 1, wherein at least one of the vias is a through-via that extends through the circuit board between the opposite sides.

3. A multi-pin edge connector assembly according to claim 1, wherein each pin has a spring portion located between the first and second ends to thereby bias the first end against the conductive surface.

4. A multi-pin edge connector assembly according to claim 1, wherein the plurality of vias comprises a first row of vias spaced from the connection edge a first distance and a second row of vias spaced from the connection edge a second distance different from the first distance.

5. A multi-pin edge connector assembly according to claim 1, wherein at least one of the plurality of vias is a blind via that extends from one of the sides and terminates in the circuit board.

6. A multi-pin edge connector assembly according to claim 5, wherein at least one of the vias is a through-via that extends through the circuit board between the opposite sides.

7. A multi-pin edge connector assembly comprising:
   a circuit board having:
      opposite sides and a connection edge extending between the opposite sides; and
      a plurality of vias with conductive surfaces formed in the circuit board adjacent the connection edge;
   an edge connector having:
      a plurality of electrically conductive pins, each pin having a first end for electrically contacting one of the conductive surfaces and a second end that projects beyond the connection edge; and
      a retainer adapted for connection to the circuit board for holding the pins in electrical contact with the conductive surfaces; and
   a plurality of openings in the circuit board, each opening extending from the connection edge to one of the vias, with each pin being located in one of the openings.

8. A multi-pin edge connector assembly according to claim 7, wherein the openings comprise bores that are formed between the opposite sides of the circuit board.

9. A multi-pin edge connector assembly according to claim 7, wherein the openings comprise slots that open to at least one of the opposite sides of the circuit board.

10. A multi-pin edge connector assembly comprising:
    a circuit board having:
       opposite sides and a connection edge extending between the opposite sides; and
       a plurality of vias with conductive surfaces formed in the circuit board adjacent the connection edge; and
    an edge connector having:
       a plurality of electrically conductive pins, each pin having a first end for electrically contacting one of the conductive surfaces and a second end that projects beyond the connection edge; and
       a retainer adapted for connection to the circuit board for holding the pins in electrical contact with the conductive surfaces, wherein material is removed from the circuit board to thereby expose the conductive surfaces of the vias in a direction toward the connection edge.

11. A multi-pin edge connector assembly according to claim 1, wherein the plurality of vias comprises front blind vias and rear blind vias, and the plurality of pins comprises front pins and rear pins that are adapted to electrically contact the front blind vias and rear blind vias, respectively.

12. A multi-pin edge connector assembly according to claim 11 and further comprising a ground plane extending between the front and rear pins to thereby electrically isolate the front pins from the rear pins.

13. A multi-pin edge connector assembly according to claim 10, wherein the plurality of vias comprises front blind vias and rear blind vias, and the plurality of pins comprises front pins and rear pins that are adapted to electrically contact the front blind vias and rear blind vias, respectively.

14. A multi-pin edge connector assembly according to claim 13 wherein the front pins and rear pins are separated by a mounting protrusion that extends from the blind vias to the connection edge.

15. A multi-pin edge connector assembly according to claim 14, wherein the mounting protrusion comprises a ground plane to thereby electrically isolate the front pins from the rear pins.

16. A multi-pin edge connector assembly comprising:
    a circuit board having:
       opposite sides and a connection edge extending between the opposite sides;
       a plurality of vias with conductive surfaces formed in the circuit board adjacent the connection edge; and
       a plurality of openings in the circuit board, each opening extending from the connection edge to one of the vias; and
    an edge connector comprising:
       a plurality of electrically conductive pins, each pin having a first end in electrical contact with one of the conductive surfaces, a second end that projects beyond the connection edge, and a middle portion located between the ends and positioned in one of the openings; and
       a retainer mounted to the circuit board for holding the pins in electrical contact with the conductive surfaces.

17. A multi-pin edge connector assembly according to claim 16, wherein the plurality of vias comprises front blind vias and rear blind vias, and the plurality of pins comprises front pins and rear pins that are adapted to electrically contact the front blind vias and rear blind vias, respectively.

18. A multi-pin edge connector assembly according to claim 16, wherein the openings comprise bores that are formed between the opposite sides of the circuit board.

19. A multi-pin edge connector assembly according to claim 18, wherein each pin has a resilient portion located between the first end and the middle portion to thereby bias the first end against the conductive surface and the middle portion against the retainer.

20. A multi-pin edge connector assembly according to claim 18, wherein the plurality of vias comprises front blind vias and rear blind vias, and the plurality of pins comprises front pins and rear pins that are adapted to electrically contact the front blind vias and rear blind vias, respectively.

21. A multi-pin edge connector assembly according to claim 16, wherein the openings comprise slots that open to at least one of the opposite sides of the circuit board.

22. A multi-pin edge connector assembly according to claim 21, wherein the plurality of vias comprises a first row of vias spaced from the connection edge a first distance and a second row of vias spaced from the connection edge a second distance different from the first distance.

23. A multi-pin edge connector assembly according to claim 21, wherein the plurality of vias comprises front blind vias and rear blind vias, and the plurality of pins comprises front pins and rear pins that are adapted to electrically contact the front blind vias and rear blind vias, respectively.

24. A multi-pin edge connect or assembly for connecting a daughter board to a mother board, comprising:

a daughter board having opposite sides and a connection edge;

a plurality of vias with conductive surfaces formed in the daughter board adjacent the connection edge;

a plurality of openings formed in the daughter board, each opening extending from the connection edge to one of the vias;

a plurality of electrically conductive pins positioned in the openings, each pin having a first end in electrical contact with one of the conductive surfaces and a second end that projects beyond the connection edge for electrically contacting a conductive surface associated with a mother board; and a retainer mounted to the daughter board for holding the pins thereon.

\* \* \* \* \*